United States Patent
Ranganathan et al.

(10) Patent No.: US 10,798,818 B2
(45) Date of Patent: Oct. 6, 2020

(54) POWER SUPPLIES INCLUDING SHIELDED MULTILAYER POWER TRANSMISSION BOARDS

(71) Applicant: Astec International Limited, Kowloon (HK)

(72) Inventors: Prabou Ranganathan, Eden Prairie, MN (US); Norman Oliva, Eden Prairie, MN (US)

(73) Assignee: Astec International Limited, Kowloon (HK)

( * ) Notice: Subject to any disclaimer, the term of this patent is extended or adjusted under 35 U.S.C. 154(b) by 0 days.

(21) Appl. No.: 15/951,810

(22) Filed: Apr. 12, 2018

(65) Prior Publication Data

US 2018/0302981 A1 Oct. 18, 2018

Related U.S. Application Data

(60) Provisional application No. 62/485,097, filed on Apr. 13, 2017.

(51) Int. Cl.
| | |
|---|---|
| *H05K 1/00* | (2006.01) |
| *H05K 1/02* | (2006.01) |
| *H05K 1/11* | (2006.01) |
| *H05K 3/36* | (2006.01) |
| *H05K 3/40* | (2006.01) |

(Continued)

(52) U.S. Cl.
CPC ......... *H05K 1/0298* (2013.01); *H05K 1/0218* (2013.01); *H05K 1/0263* (2013.01); *H05K 1/11* (2013.01); *H05K 1/142* (2013.01); *H05K 1/16* (2013.01); *H05K 3/36* (2013.01); *H05K 3/40* (2013.01); *H05K 1/0233* (2013.01); *H05K 3/366* (2013.01); *H05K 3/368* (2013.01); *H05K 2201/0715* (2013.01); *H05K 2201/09309* (2013.01); *H05K 2201/09618* (2013.01);

(Continued)

(58) Field of Classification Search
CPC .. H05K 1/0298; H05K 1/0218; H05K 1/0263; H05K 1/11; H05K 1/142; H05K 1/16; H05K 3/36; H05K 3/40; H05K 1/0233; H05K 3/366; H05K 3/368; H05K 2201/0715; H05K 2201/09309; H05K 2201/09618; H05K 2201/09981; H05K 2201/1018

See application file for complete search history.

(56) References Cited

U.S. PATENT DOCUMENTS

| | | |
|---|---|---|
| 3,405,227 A | 10/1968 | Hazlett |
| 5,376,759 A | 12/1994 | Marx et al. |

(Continued)

*Primary Examiner* — Pete T Lee

(57) ABSTRACT

A power supply includes a main circuit board and a multilayer power transmission board for transmitting power from one area of the main circuit board to another area of the main circuit board. The main circuit board includes a power input connector having power connections. The multilayer power transmission board includes conductive layers electrically coupled to the power connections of the power input connector, and a dielectric medium positioned between each of the conductive layers. The conductive layers of the multilayer board may include at least two conductive neutral layers and at least two conductive line layers positioned in an alternating configuration. Other example power supplies, multilayer boards and methods of manufacturing power supplies are also disclosed.

16 Claims, 7 Drawing Sheets

(51) Int. Cl.
 *H05K 1/16* (2006.01)
 *H05K 1/14* (2006.01)
(52) U.S. Cl.
 CPC ............. *H05K 2201/09981* (2013.01); *H05K 2201/10189* (2013.01)

(56) References Cited

U.S. PATENT DOCUMENTS

| | | | |
|---|---|---|---|
| 5,677,515 A | 10/1997 | Selk et al. | |
| 5,901,056 A | 5/1999 | Hung | |
| 5,990,776 A | 11/1999 | Jitaru | |
| 6,072,699 A * | 6/2000 | Horine | G11C 5/04 174/261 |
| 6,075,211 A * | 6/2000 | Tohya | H05K 1/0233 174/255 |
| 6,441,313 B1 * | 8/2002 | Novak | H01L 23/50 174/255 |
| 6,801,027 B2 | 10/2004 | Hann et al. | |
| 7,088,591 B2 | 8/2006 | Kishimoto et al. | |
| 7,499,301 B2 | 3/2009 | Zhou | |
| 8,274,181 B2 | 9/2012 | Lu | |
| 9,125,303 B2 | 9/2015 | Fetterman et al. | |
| 2003/0076197 A1 * | 4/2003 | Novak | H05K 1/0234 333/136 |
| 2010/0302811 A1 | 12/2010 | Saint-Pierre | |
| 2011/0149543 A1 * | 6/2011 | Kamoi | H05K 3/366 361/803 |
| 2013/0314954 A1 * | 11/2013 | Fetterman | H05K 1/0213 363/44 |

* cited by examiner

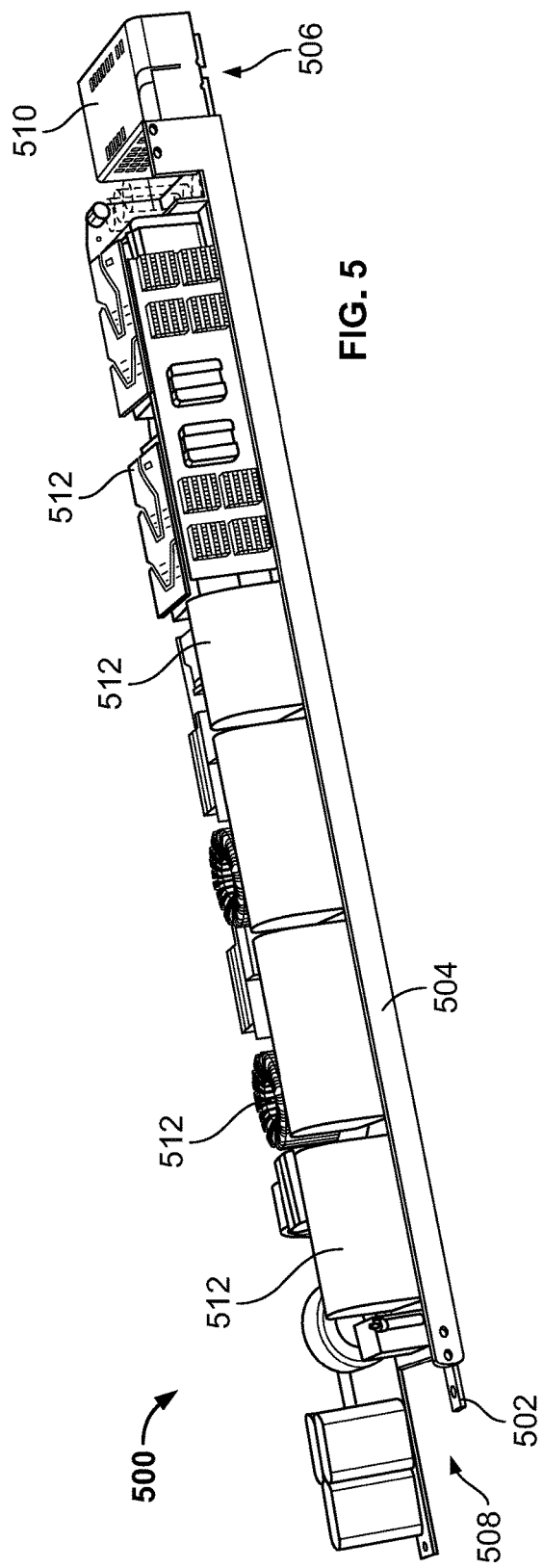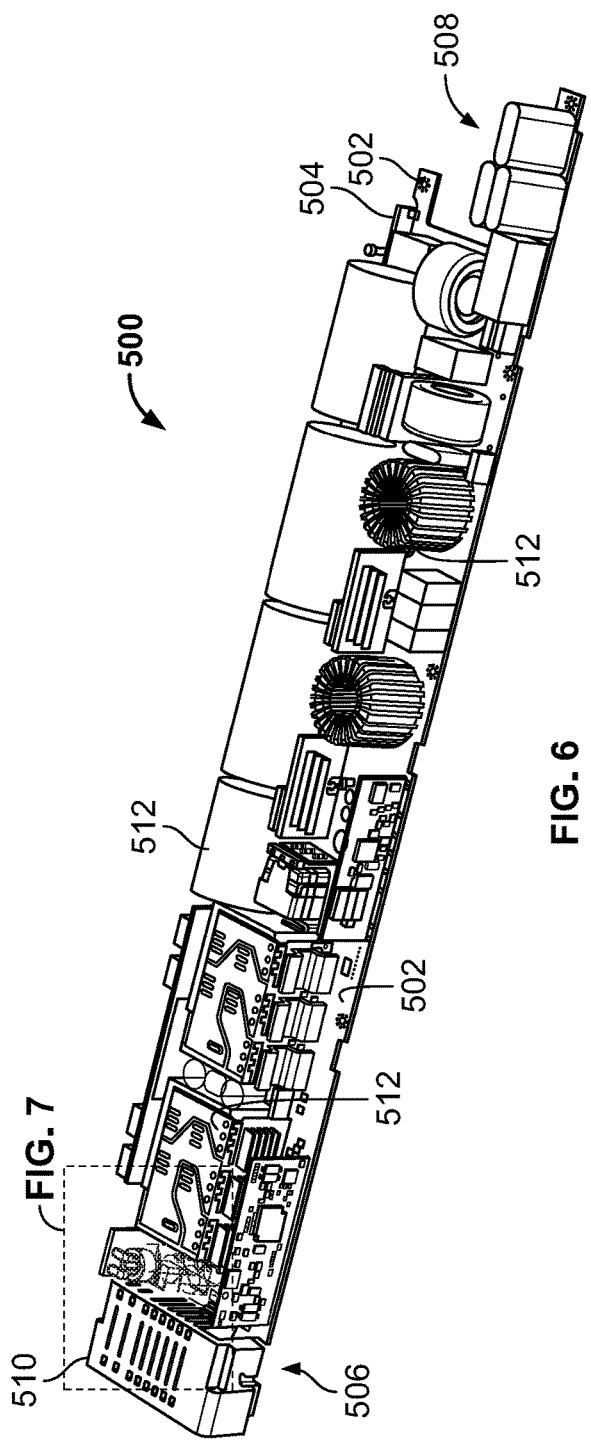

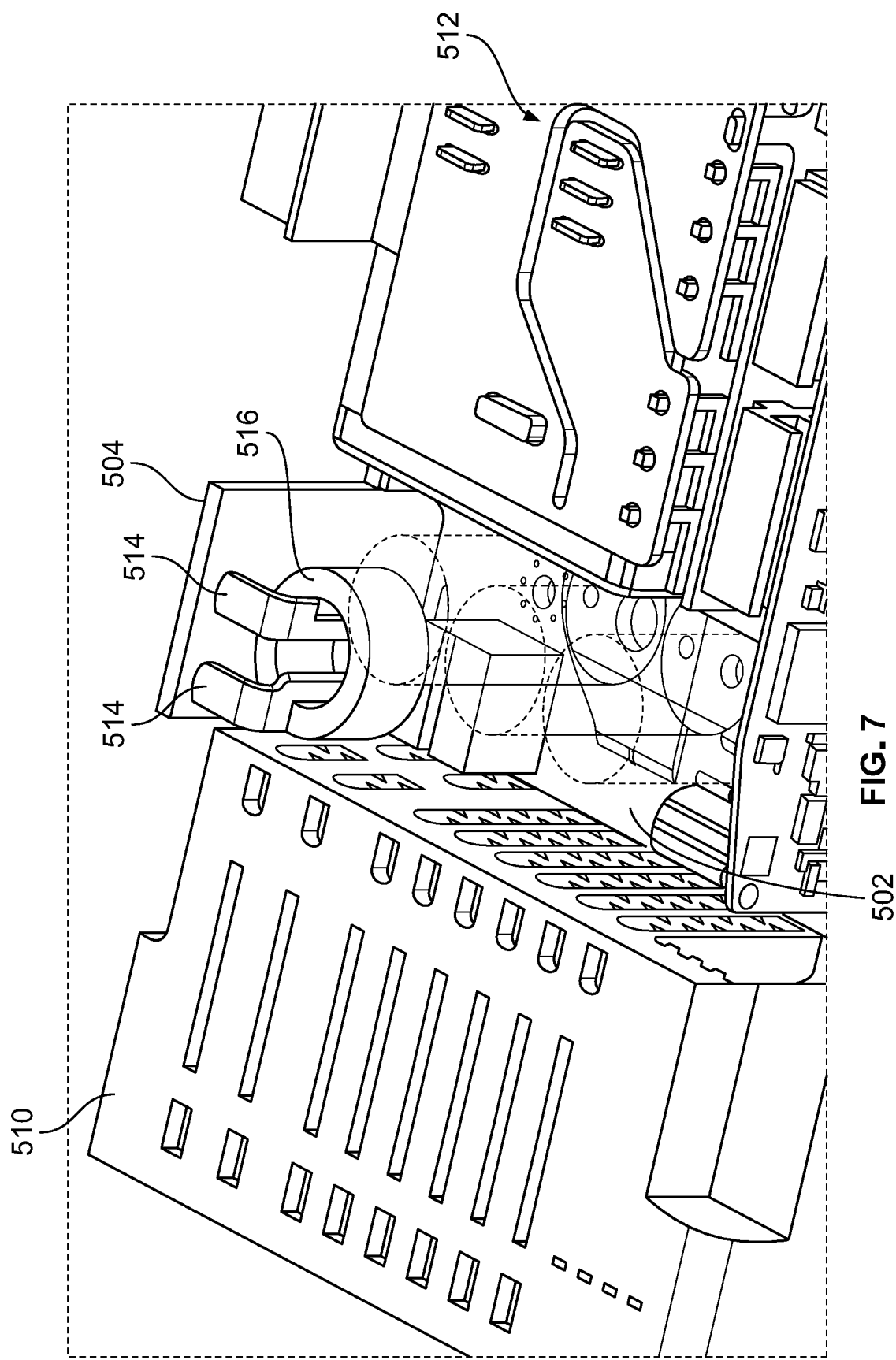

POWER SUPPLIES INCLUDING SHIELDED MULTILAYER POWER TRANSMISSION BOARDS

CROSS-REFERENCE TO RELATED APPLICATION

This application claims the benefit and priority of U.S. Provisional Application No. 62/485,097 filed Apr. 13, 2017. The entire disclosure of the above application is incorporated herein by reference.

FIELD

The present disclosure relates to powers supplies including shielded multilayer power transmission boards.

BACKGROUND

This section provides background information related to the present disclosure which is not necessarily prior art.

Electrical power supplies commonly include main circuit boards for supporting various electrical components. In some instances, the power supplies include AC jumper boards having a neutral layer and a hot layer for moving AC power between different areas of the main circuit boards.

SUMMARY

This section provides a general summary of the disclosure, and is not a comprehensive disclosure of its full scope or all of its features.

According to one aspect of the present disclosure, a power supply includes a main circuit board and a multilayer power transmission board for transmitting AC power from one area of the main circuit board to another area of the main circuit board. The main circuit board includes an AC power input connector having a neutral power connection and a line power connection. The multilayer power transmission board includes at least two conductive neutral layers electrically coupled to the neutral power connection of the AC power input connector, at least two conductive line layers electrically coupled to the line power connection of the AC power input connector, and a dielectric medium positioned between each of the conductive layers. The conductive neutral layers and the conductive line layers are positioned in an alternating configuration.

According to another aspect of the present disclosure, a power supply includes a main circuit board and a multilayer power transmission board for transmitting power from one area of the main circuit board to another area of the main circuit board. The main circuit board includes a power input connector having a first power connection and a second power connection. The multilayer power transmission board includes a first conductive layer electrically coupled to the first power connection of the power input connector, a second conductive layer electrically coupled to the second power connection of the power input connector, a third conductive layer separating the first conductive layer and the second conductive layer, and a dielectric medium positioned between each of the conductive layers.

According to another aspect of the present disclosure, a method of manufacturing a power supply is disclosed. The power supply includes a main circuit board and a power transmission multilayer board. The multilayer power transmission multilayer board includes a conductive neutral layer having an inner side and an outer side, a conductive line layer having an inner side and an outer side, a dielectric medium positioned between the conductive neutral layer and the conductive line layer, and at least two conductive ground layers. The inner side of the conductive neutral layer faces the inner side of the conductive line layer. One of the two conductive ground layers is positioned on the outer side of the conductive neutral layer. Another one of the two conductive ground layers is positioned on the outer side of the conductive line layer. The method includes forming at least two slots in the multilayer power transmission board to expose at least a portion of an interior of the power transmission multilayer board, plating with a conductive material the exposed interior of the multilayer power transmission board so that the conductive material is in contact with the two conductive ground layers, and electrically coupling the multilayer power transmission board and the main circuit board.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 5 is an isometric front view of a power supply including a main circuit board and a multilayer power transmission board according to another example embodiment.

FIG. 6 is an isometric rear view of the power supply of FIG. 5.

FIG. 7 is an enlarged portion of the power supply of FIG. 6.

Corresponding reference numerals indicate corresponding parts and/or features throughout the several views of the drawings.

DETAILED DESCRIPTION

Figure 1:
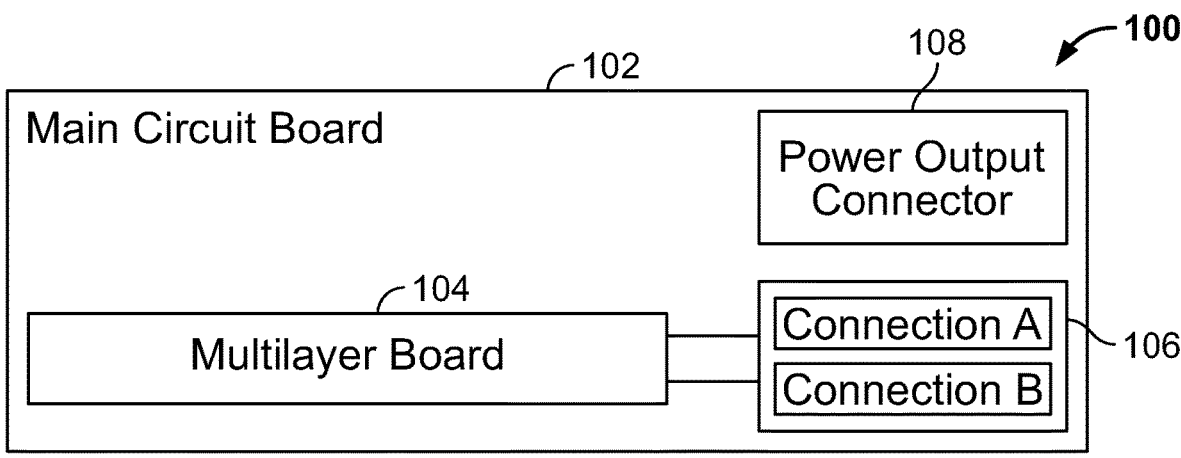
FIG. 1 is a block diagram of a power supply including a main circuit board and a multilayer power transmission board for transmitting power from one area of the main circuit board to another area of the main circuit board according to one example embodiment of the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

A power supply according to one example embodiment of the present disclosure is illustrated in FIG. 1 and indicated generally by reference number 100. As shown in FIG. 1, the power supply 100 includes a main circuit board 102 and a multilayer power transmission board 104. The main circuit board 102 includes a power input connector 106 having at least two power connections A, B, and a power output connector 108. As further explained below, the multilayer power transmission board 104 includes one or more electrically conductive layers for transmitting power from one area of the main circuit board 102 to another area of the main circuit board 102.

The power connectors 106, 108 may be AC power connectors or DC power connectors. If the power input connector 106 is an AC power input connector, the power connection A may be considered a neutral power connection and the power connection B may be considered a line (e.g. a hot) power connection, or vice versa. Alternatively, the power input connector 106 may be a DC power input connector. In that case, the power connection A may be considered a positive power connection and the power connection B may be considered a reference (e.g., ground) power connection, or vice versa. In other embodiments, the power input connector 106 may include one or more other connections for ground, additional neutral and/or line connections, positive DC connections, data/signal connections, etc.

Additionally, the power output connector 108 may include various connections such as one or more AC neutral connections, AC line connections, AC and/or DC ground connections, hot DC connections, data/signal connections, etc. Additionally, the power output connector 108 may include the same or a different number of power connections as the power input connector 106.

As shown in FIG. 1, the power connectors 106, 108 are adjacent to each other. For example, and as shown in FIG. 1, the power connectors 106, 108 are positioned adjacent one side surface, edge, etc. of the main circuit board 102. In other embodiments, one connector may be near one edge of the main circuit board 102 and the other connector may be near an opposing edge of the main circuit board 102.

The main circuit board 102 (and any other main circuit boards disclosed herein) may be any suitable circuit board. For example, the main circuit board 102 may be a printed circuit board (PCB), etc. Likewise, the multilayer power transmission board 104 (and any other multilayer board disclosed herein) may be any suitable power transmission board. For example, the multilayer board 104 may be a circuit board (e.g., a PCB, etc.) and/or another suitable board for transmitting power.

Additionally, although not shown in FIG. 1, the main circuit board 102 may include one or more electrical components disposed on one or more surfaces of the main circuit board 102. For example, one or more filters, capacitors, inductors, transformers, power switches, rectification circuits, control circuits (e.g., control circuit integrated circuits, etc.), etc. may be coupled to a top surface and/or a bottom surface of the main circuit board 102. The electrical components may be positioned on the main circuit board 102 and adjacent to the multilayer board 104. In some examples, the electrical components may be electrically coupled to one or more electrically conductive layers of the multilayer board 104.

Power converter circuitry (e.g., collectively forming one or more power converters) may be electrically coupled between the power input connector 106 and the power output connector 108. For example, the electrical components mentioned above (e.g., the capacitors, the inductors, the transformers, the power switches, etc.) and/or other suitable electrical components may form the power converter(s). The power converter(s) may be positioned adjacent to the multilayer board 104, and electrically coupled to one or more electrically conductive layers of the multilayer board 104. The power converter(s) may include an AC/DC power converter, a DC/DC converter, etc., and have one or more suitable topologies (e.g., buck converter topologies, boost converter topologies, flyback converter topologies, forward converter topologies etc.).

The multilayer board 104 may include one or more outer conductive layers. For example, the outer conductive layers may form an outer perimeter of the multilayer board 104. In other examples, a dielectric medium may be placed on the exterior facing side of the outer conductive layers. In either example, the conductive layers may substantially surround an interior portion of the multilayer board 104 to provide shielding for internal layers of the multilayer board 104.

For example, the outer conductive layers may shield noise inner conductive layers of the multilayer board 104 from electromagnetic fields generated by electrical components on the main circuit board 102. The noise may include, for example, electromagnetic interference (EMI) (sometimes referred to as radio frequency interference (RFI)), etc. As such, the conductive layers may help prevent noise from interfering with the inner conductive power layers of the multilayer board 104, the input at the input connector 106, etc. Thus, by shielding at least some noise in the power supply 100, other filters (e.g., controller area network (CAN) filters, etc.) may not be required in the power supply 100. In turn, valuable circuit board space may be saved and costs may be reduced.

In some embodiments, one or more of the outer layers may be grounded. For example, the outer layers may be electrically coupled to ground (e.g., a ground trace, etc.) on the main circuit board 102 and/or at another suitable location. By grounding one or more of the outer layers, the board 104 may provide improved shielding performance as compared to boards having ungrounded outer layers.

As explained above, the multilayer power transmission board 104 transmits power from one area of the main circuit board 102 to another area of the main circuit board 102. For example, the multilayer board 104 may transmit power from one side of the main circuit board 102 to the opposing side of the main circuit board 102. This configuration may free up valuable space on the main circuit board 102 for other components, reduce the size of the circuit board, etc.

The AC or DC power may be transmitted between different areas of the main circuit board 102 by one or more conductive layers in the multilayer board 104. For example, the multilayer power transmission board 104 of FIG. 1 includes one or more other electrically conductive layers (not shown) located between the outer conductive layers. These conductive layers may include, for example, a conductive neutral layer and a conductive line layer for transmitting AC power from one area of the main circuit board 102 to another area of the main circuit board 102. In other embodiments, the conductive layers may include, for example, a positive conductive layer and a reference conductive layer for transmitting DC power from one area of the main circuit board 102 to another area of the main circuit board 102.

Figure 2A:
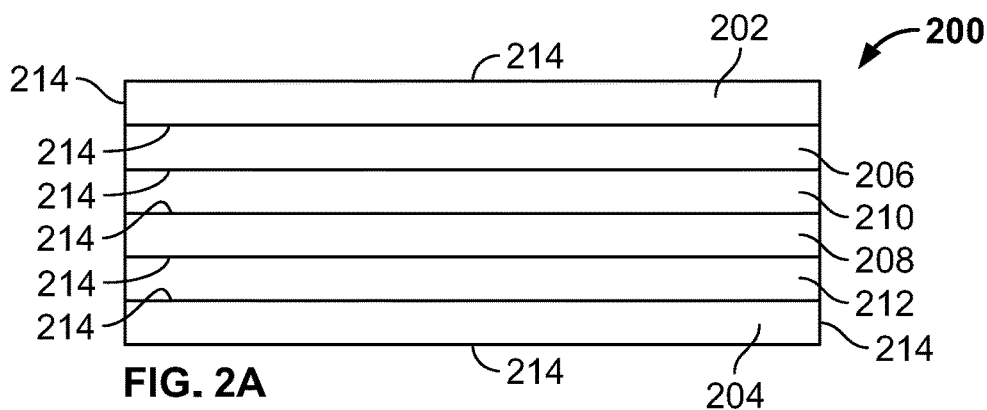
FIG. 2A is a block diagram an AC multilayer power transmission board employable in the power supply of FIG. 1, according to another example embodiment.
Figure 3:
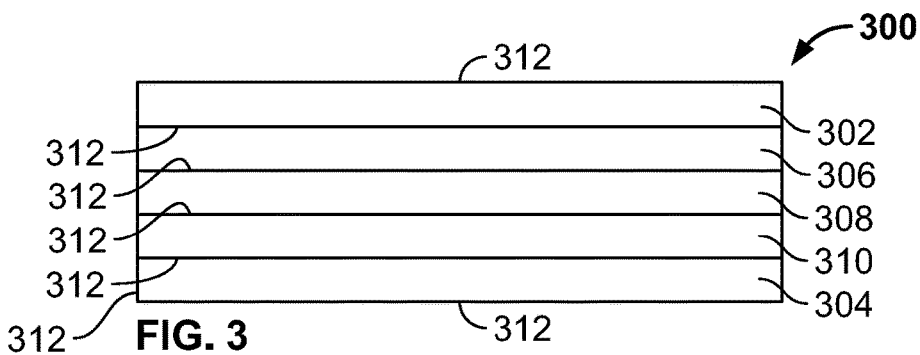
FIG. 3 is a block diagram a multilayer power transmission board employable in the power supply of FIG. 1, according to another example embodiment.

For example, FIGS. 2A and 3 illustrate cross sectional views of power transmission multilayer boards 200, 300, respectively. Either of the multilayer boards 200, 300 and/or another suitable board may be used for the multilayer power transmission board 104 of FIG. 1.

As shown in FIG. 2A, the multilayer power transmission board 200 includes two outer electrically conductive layers 202, 204, four inner electrically conductive layers 206, 208, 210, 212 positioned between the outer layers 202, 204, and a dielectric medium 214 positioned between each of the conductive layers 202, 204, 206, 208, 210, 212. The dielectric medium 214 electrically isolates the conductive layers 202, 204, 206, 208, 210, 212 from each other.

Additionally, and as shown in FIG. 2A, the dielectric medium 214 extends around an exterior side of the outer layers 202, 204. Alternatively, the dielectric medium 214 may not extend around the exterior side of the outer layers 202, 204, may extend around only a portion of the exterior side of the outer layer 202 and/or the outer layer 204, etc.

When the board 200 is used in the power supply 100 of FIG. 1, the conductive layers 206, 208 may be two AC neutral conductors, and the conductive layers 210, 212 may be two AC line conductors (e.g., hot conductors). In such examples, the conductive neutral layers 206, 208 are electrically coupled to the connection designated as the neutral connection (e.g., the connection A) of the power input connector 106 of FIG. 1, and the conductive line layers 210, 212 are electrically coupled to the connection designated as the line connection (e.g., the connection B) of the power input connector 106 of FIG. 1.

Figure 2B:
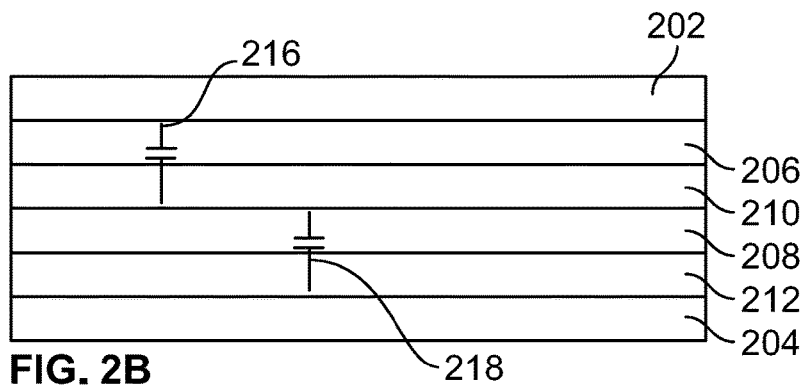
FIG. 2B is the AC multilayer power transmission board of FIG. 2A with X-capacitors, according to yet another example embodiment.

In the particular example of FIG. 2B, the conductive neutral layers 206, 208 and the conductive line layers 210, 212 are positioned in an alternating configuration. For example, the conductive neutral layer 206 is adjacent to the outer layer 202, the conductive line layer 210 is adjacent to the conductive neutral layer 206, the conductive neutral layer 208 is adjacent to the conductive line layer 210, and the conductive line layer 212 is adjacent to the conductive neutral layer 208 and the outer layer 204. As shown, the conductive line layer 210 is sandwiched between the conductive neutral layers 206, 208, and the conductive neutral layer 208 is sandwiched between the conductive line layers 210, 212. As such, the conductive layers 206, 208, 210, 212 form an alternating configuration of one neutral layer and one line layer.

The alternating configuration of one neutral layer and one line layer can form one or more X-capacitors to suppress differential mode noise, and in turn help reduce EMI. For example, and as shown in FIG. 2B, one X-capacitor 216 may be formed between the conductive line layer 210 and the conductive neutral layer 206, and another X-capacitor 218 may be formed between the conductive line layer 212 and the conductive neutral layer 208. In the particular example of FIG. 2B, the X-capacitor 216 is formed between the side of the conductive line layer 210 adjacent to the conductive neutral layer 208 and the side of the conductive neutral layer 206 adjacent to the outer layer 202. The X-capacitor 218 is formed between the side of the conductive line layer 212 adjacent to the outer layer 204 and the side of the conductive neutral layer 208 adjacent to the conductive line layer 210.

As shown in FIG. 3, the multilayer power transmission board 300 includes the two electrically conductive outer layers 302, 304, three inner electrically conductive layers 306, 308, 310 positioned between the outer layers 302, 304, and a dielectric medium 312 positioned between each of the conductive layers 302, 304, 306, 308, 310 to electrically isolate the conductive layers from each other. The dielectric medium 312 of FIG. 3 may extend completely around an exterior side of the outer layers 302, 304 (as shown), may not extend around the exterior side of the outer layers 302, 304, etc. Additionally, the conductive outer layers 302, 304 may provide shielding for the inner conductive layers 306, 310, as explained above.

In some examples, the conductive layer 306 of FIG. 3 may be an AC neutral conductor, and the conductive layer 310 of FIG. 3 may be an AC line conductor. In such examples, the conductive layer 306 is a conductive neutral layer and the conductive layer 310 is a conductive line layer. Therefore, if the multilayer board 300 is employed in the power supply 100 of FIG. 1, the conductive neutral layer 306 may be electrically coupled to the connection designated as the neutral power connection (e.g., the connection A), and the conductive line layer 310 may be electrically coupled to the connection designated as the line power connection (e.g., the connection B).

When the board 300 is used in the power supply 100 of FIG. 1, the conductive layer 306 is a positive DC conductor, and the conductive layer 310 is a reference conductor. In such examples, the conductive layer 306 is electrically coupled to the connection designated as the positive power connection (e.g., the connection A), and the conductive layer 310 is electrically coupled to the connection designated as the reference power connection (e.g., the connection B). Alternatively, the conductive layer 306 may be a reference conductor and the conductive layer 310 may be a positive DC conductor when the board 300 is used in the power supply 100 of FIG. 1.

As shown in FIG. 3, the conductive layer 308 extends between the conductive layers 306, 310. As such, the conductive layer 308 separates the conductive layer 306 and the conductive layer 310. Due to the conductive layer 308 and the layers 302, 304, each conductive layer 306, 310 is shielded individually. In other words, each of the two shielding areas created by the conductive layer 308 and the layers 302, 304 shields only one conductive layer in the particular example of FIG. 3.

Although not shown, the conductive layers 202, 204 of FIGS. 2a and 2b and/or the conductive layers 302, 304, 308 of FIG. 3 may be coupled together via an electrically conductive material, as explained herein. As such, the inner conductive layers 206, 208, 210, 212 of FIGS. 2a and 2b and/or the inner conductive layers 306, 310 of FIG. 3 may be at least partially shielded, surrounded, enclosed, etc. by conductive layer(s). For example, the conductive layers 302, 304, 308 of FIG. 3 may be electrically coupled together thereby substantially enclosing the conductive neutral layer 306 and the conductive line layer 310 to shield the conductive layers 306, 310, as explained herein. This configuration is similar to a coaxial cable positioned inside another coaxial cable.

Further, the conductive layers 202, 204 of FIGS. 2a and 2b and/or the conductive layers 302, 304, 308 of FIG. 3 may be grounded, as explained above (e.g., to provide improved shielding performance, etc.).

Figure 4A:
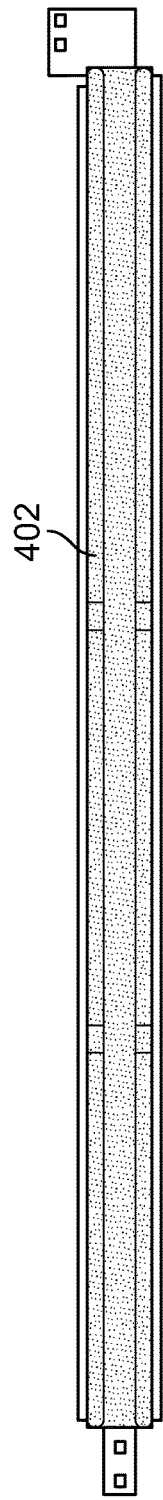
FIG. 4A is a top view of an outer conductive layer for a multilayer power transmission board according to yet another example embodiment.
Figure 4B:
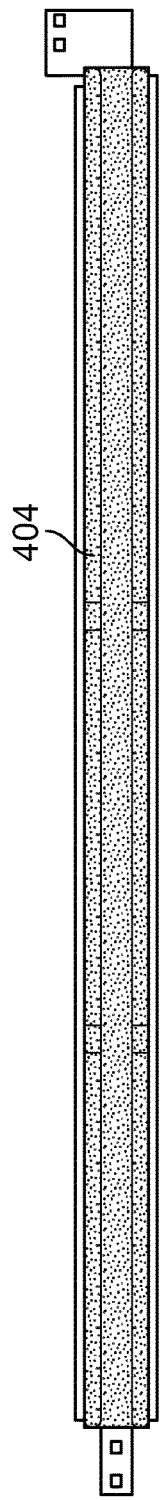
FIG. 4B is a top view of another outer conductive layer for the multilayer power transmission board of FIG. 4A, according to another example embodiment.
Figure 4C:
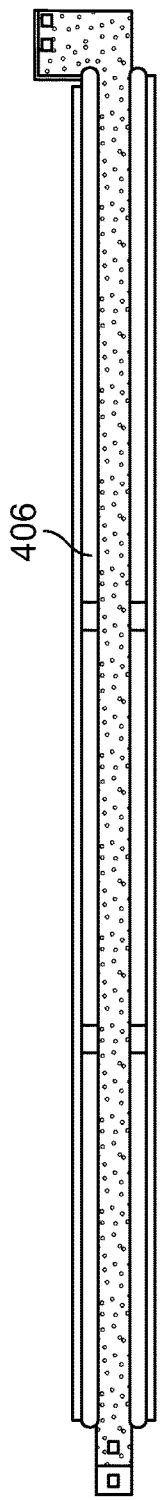
FIG. 4C is a top view of an inner conductive layer for the multilayer power transmission board of FIG. 4A, according to yet another example embodiment.

FIGS. 4A, 4B and 4C illustrate conductive layers 402, 404, 406 of a power transmission multilayer board that may be used in the power supply 100 of FIG. 1 and/or another suitable power supply. The conductive layer 406 is an inner conductive layer similar to any one of the conductive layers 206, 208, 210, 212 of FIGS. 2a and 2b and/or the conductive layers 306, 310 of FIG. 3. The conductive layers 402, 404 are outer layers similar to the layers 202, 204 of FIGS. 2a and 2b and/or the layers 302, 304 of FIG. 3. The outer edges of the conductive layers 402, 404 extend toward each other and electrically couple together to substantially enclose the conductive layer 406 when the layers 402, 404, 406 are formed into a multilayer board. This configuration shields the conductive layer 406, as explained above. The outer edges of the conductive layers 402, 404 may be formed by platting an edge of the multilayer board, as further explained below.

The power transmission multilayer boards disclosed herein and the main circuit boards disclosed herein may be orientated in any suitable manner relative to each. For example, and with reference to FIG. 1, the multilayer board 104 may be substantially parallel to the main circuit board 102, as shown. In other embodiments, the multilayer board 104 may be substantially perpendicular to the main circuit board 102.

For example, FIGS. 5-7 illustrate a power supply 500 including a main circuit board 502 and a multilayer power transmission board 504 extending in a plane substantially perpendicular to the main circuit board 502. This perpendicular orientation of the multilayer board 504 may save space on the main circuit board 502, as explained herein. Alternatively, the multilayer board 504 may extend in a plane substantially parallel to the main circuit board 502 without departing from the scope of this disclosure.

The multilayer board 504 may include one or more of the multilayer combinations shown in FIGS. 2-4.

As shown in FIGS. 5-7, the power supply 500 includes a power connector 510 adjacent one side 506 of the main circuit board 502. In this particular example, the power connector 510 includes an AC power input connector and a DC power output connector. The AC power input connector has a neutral connection and a line connection for coupling to one or more layers of the multilayer board 504, as explained herein. Alternatively, the power connector 510 may include a DC power input connector if desired.

The multilayer power transmission board 504 extends along an edge surface of the main circuit board 502. For example, in the particular example shown in FIGS. 5 and 6, the multilayer board 504 is attached to the main circuit board 502 (e.g., on the edge surface and/or another surface of the main circuit board 502), and extends between the side 506 of the main circuit board 502 and another side 508 of the main circuit board 502. As shown, the multilayer board 504 extends substantially the length of the main circuit board 502. This configuration may provide at least some structural support for the main circuit board 502 thereby preventing the board 502 from warping, twisting, breaking, etc. due to the weight of components on the board 502.

Additionally, and as shown in FIGS. 5-7, the power supply 500 includes various electrical components 512 disposed on the top surface of the main circuit board 502. The electrical components 512 may include one or more capacitors, inductors, transformers, power switches, rectification circuits, control circuits (e.g., control circuit integrated circuits, etc.), etc. The electrical components 512 of the power supply 500 may be used to form one or more AC/DC converters, DC/DC converters, filters, etc.

For example, an AC/DC converter may be positioned adjacent the side 508 of the main circuit board 502. In such examples, the AC/DC converter may be electrically coupled to layer(s) of the multilayer board 504 to receive AC input power. The AC/DC converter then outputs DC power to one or more components 512 on the board, the power connector 510, etc. For example, DC power may be provided to one or more DC/DC converters to regulate, increase, decrease, etc. the DC voltage and/or current before it is provided to the DC power output connector of the power connector 510.

As shown in FIG. 7, the multilayer board 504 includes a power input 514 electrically coupled to the AC power input connector of the power connector 510. As shown, the main circuit board 502 includes a filter 516 electrically coupled between the power connector 510 (e.g., the AC power input connector) and the power input 514 of the multilayer board 504. In the particular example shown in FIGS. 5-7, the filter 516 is a common mode choke (e.g., a single turn common mode choke, etc.). Alternatively, the filter 516 may include another suitable choke, etc.

Figure 8A:
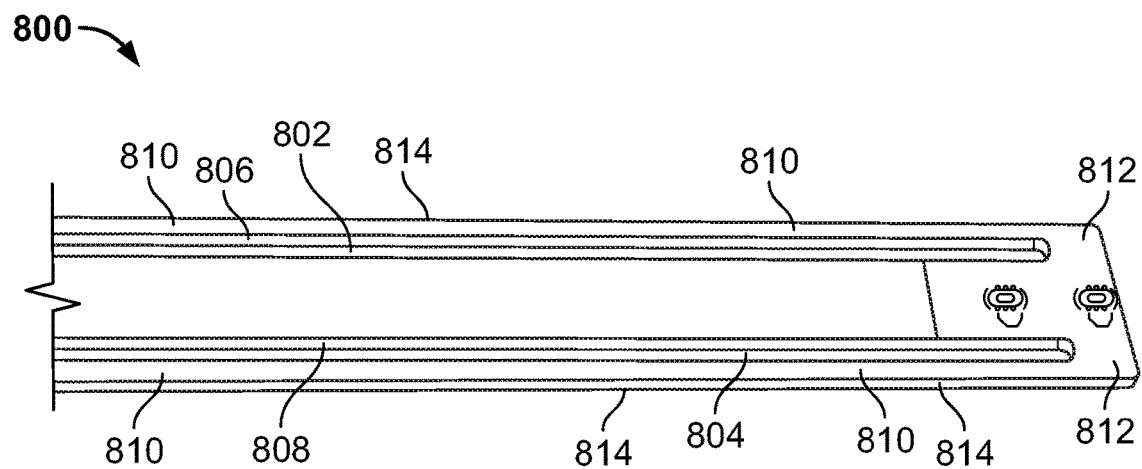
FIG. 8A is an isometric top view of a portion of a multilayer power transmission board having plated slots forming outer conductive layers of the board, according to yet another example embodiment.
Figure 8B:
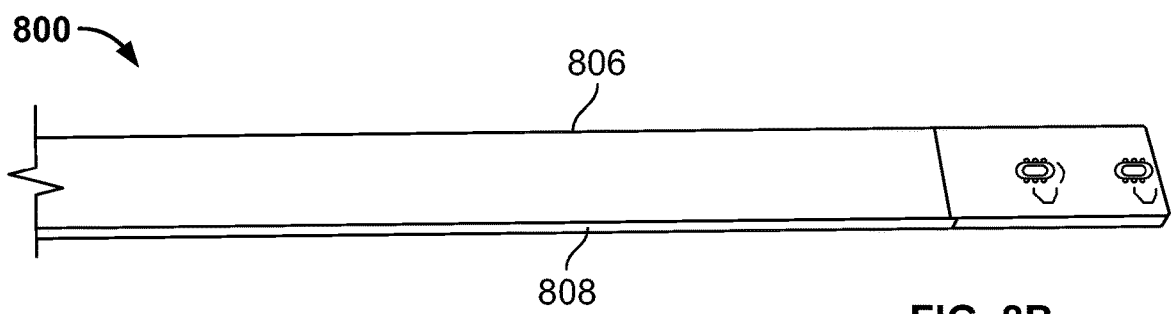
FIG. 8B is an isometric top view of the multilayer board of FIG. 8A with a portion of the board removed to form the outer conductive layers, according to another example embodiment.

The power supplies disclosed herein may be manufactured in any suitable manner. For example, FIGS. 8A and 8B illustrate a portion of a multilayer power transmission board 800 that may be used in any one of the power supplies disclosed herein. The multilayer board 800 may include two or more conductive layers including, for example, outer conductive layers (e.g., outer ground layers, etc.) and inner conductive layers (e.g., one or more inner ground layers, conductive neutral layers, conductive line layers, etc.).

As shown in FIG. 8A, two slots 802, 804 are formed in the multilayer power transmission board 800 to expose at least a portion of an interior 806, 808 of the multilayer board 800. For example, the slots 802, 804 may be milled out of the multilayer board 800 on opposing sides of the board. Alternatively, the slots 802, 804 may be formed in the multilayer board 800 in another suitable manner.

As shown, the slots 802, 804 are defined by the multilayer board 800. For example, and as shown in FIG. 8A, the slots 802, 804 are completely defined by the multilayer board 800 such that the slots are enclosed by the board 800. In such examples, the two slots 802, 804 are formed within a perimeter of the multilayer board 800. In other embodiments, the slots 802, 804 may be at least partially defined by the multilayer board 800.

The exposed interior 806, 808 of the multilayer board 800 is then plated with a conductive material. For example, the conductive ground layers of the multilayer board 800 may extend to an outer periphery (e.g., an outer perimeter 814, an area adjacent the outer perimeter 814, etc.) of the multilayer board 800. As such, after the slots 802, 804 are formed, the conductive ground layers are exposed along the interior 806, 808 of the multilayer board 800. Thus, when the conductive material is plated on the multilayer board 800, the conductive material makes contact with, and therefore electrically couples together, the inner and/or outer conductive ground layers of the multilayer board 800.

As shown in FIG. 8A, this conductive material may plate the entire exposed interior 806, 808 of the multilayer board 800. In other embodiments, the conductive material may plate only portions (e.g., an inner side) of the exposed interior 806, 808 of the multilayer board 800 if desired.

In the particular example of FIG. 8A, the slots 802, 804 and the conductive material on the exposed interior 806, 808 of the multilayer board 800 extend continuously across the length of the multilayer board 800. For example, the slots 802, 804 may extend continuously from opposing sides of the board. The conductive material may then plate the entire length of each slot 802, 804. This may ensure the grounded conductive layers (including the plated conductive material) substantially surround the inner conductive layers.

Figure 9:
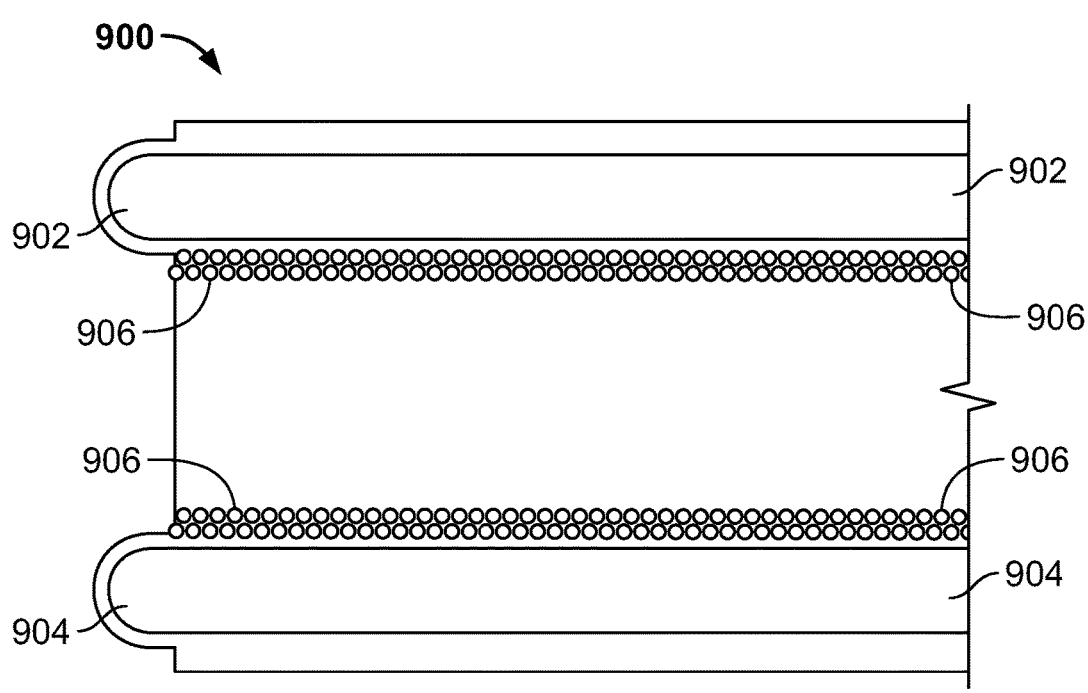
FIG. 9 is a top view of a portion of a multilayer power transmission board having conductive vias on opposing sides of the board according to yet another example embodiment.

In other embodiments, the inner and/or outer conductive layers (e.g., ground layers) of the multilayer board 800 may be electrically coupled together in another suitable manner. For example, FIG. 9 illustrates a portion of a multilayer power transmission board 900 including slots 902, 904 substantially similar to the slots 802, 804 of FIG. 8A. The multilayer board 900 of FIG. 9, however, includes vias 906 extending between surfaces of the board. The vias 906 are plated with a conductive material that makes contact with, and therefore electrically couples together, the inner and/or outer conductive layers (e.g., ground layers) of the multilayer board 900, as explained above.

As shown in FIG. 9, the board 900 includes two rows of vias 906 on each side of the board 900. In other embodiments, more or less rows of vias may be employed if desired. Additionally, the rows of plated vias may extend substantially the entire length of the board 900 to ensure the electrically coupled conductive layers and the vias 906 substantially surround the inner conductive power layers, as explained above.

Referring to FIGS. 8 and 9, the multilayer boards 800, 900 of FIGS. 8 and 9 each may be electrically coupled to a main circuit board of the power supply. Preferably, this occurs after the slots 802, 804 are formed and plated. For example, a portion of the plated conductive material (e.g., along the exposed surface of the board 800, the vias 906, etc.) may contact a ground trace, etc. on the main circuit board (e.g., the main circuit board 102 of FIG. 1). In some embodiments, one or more conductive connections may be used to physically attach and electrically couple the multilayer boards 800, 900 to main circuit boards.

In some embodiments, one or more portions of the multilayer board 800, 900 of FIGS. 8 and 9 may be removed. For example, and as shown in FIG. 8A, side portions 810, end portions 812, etc. between the slots 802, 804 and the perimeter 814 of the multilayer board 800 may remain after the slots 802, 804 are formed. These portions 810, 812 may be removed (e.g., cut, broke, etc. off at a mouse bite, break points, etc.) to expose the plated interior 806, 808, as shown in the multilayer board 800 of FIG. 8B. The multilayer board 900 of FIG. 9 includes similar removable side portions, end portions, etc.

Figure 10:
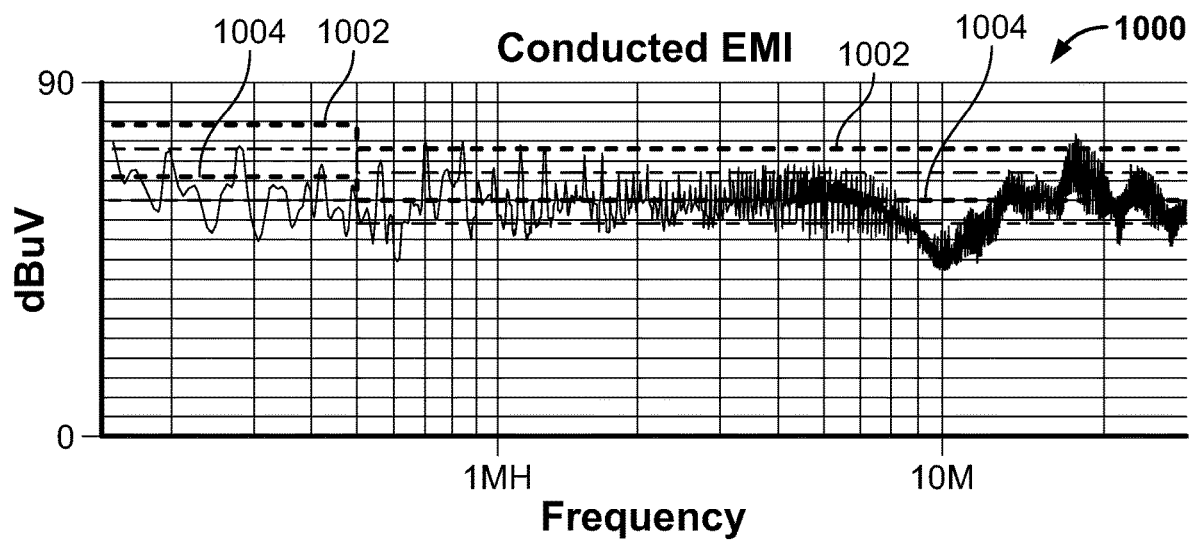
FIG. 10 is a graph of conducted EMI in a power supply having a multilayer board without outer conductive ground layers.

FIG. 10 illustrates a graph 1000 of conducted EMI (dBpV) in a power supply ranging from about 150 kHz to about 30 MHz. In this particular example, the power supply includes a main board, a multilayer board extending across the length of the main board, and an EMI filter positioned on an opposing side of the main board relative to an input/output power connector. The multilayer board, however, does not include outer conductive ground layers coupled together, as explained herein. This power supply configuration allows conductive AC power lines in the multilayer board to pick-up electrical noise/magnetic noise from electrical components (e.g., switching power converters, DC-DC transformers, etc.), which are positioned on the main board adjacent to the multilayer board. This causes the conducted EMI in the power supply to rise above Class A international limits (represented by lines 1002, 1004), as shown in the graph 1000.

Figure 11:
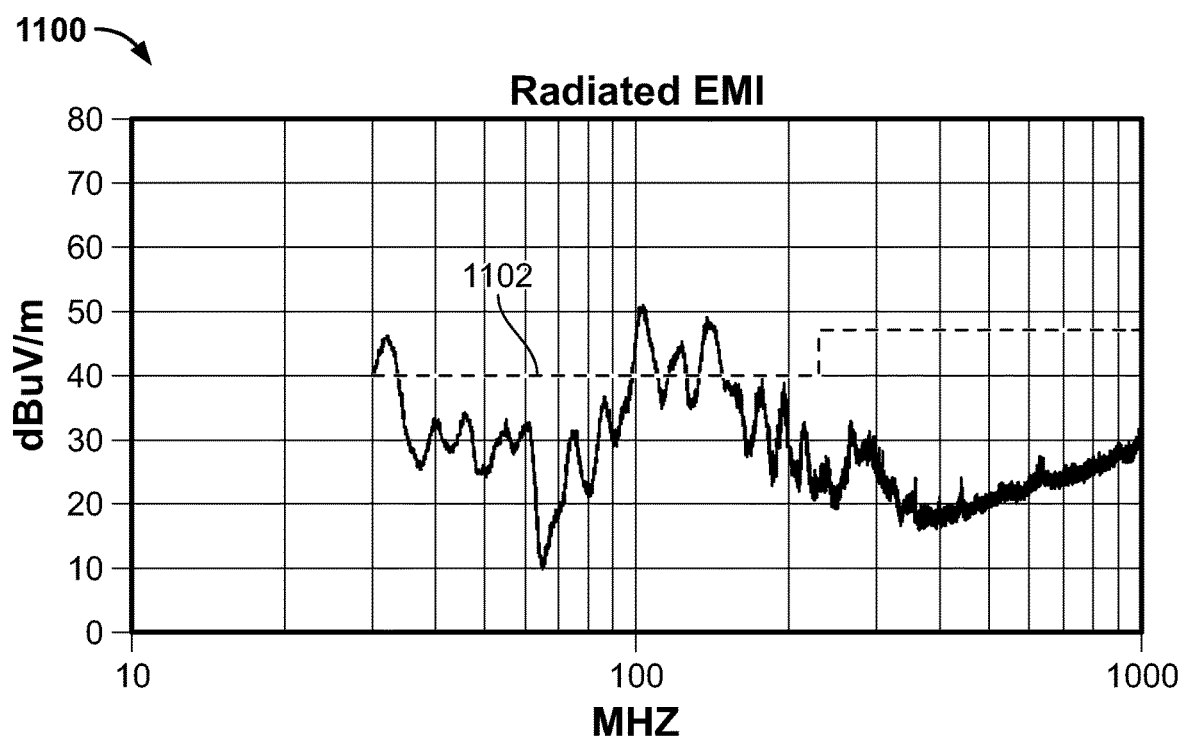
FIG. 11 is a graph of radiated EMI in the power supply of FIG. 10.

FIG. 11 illustrates a graph 1100 of the radiated EMI (dBpV/m) ranging from about 30 MHz to about 1 GHz in the power supply explained above with reference to FIG. 10. As shown, the radiated EMI exceeds Class A international limits (represented by line 1104).

Figure 12:
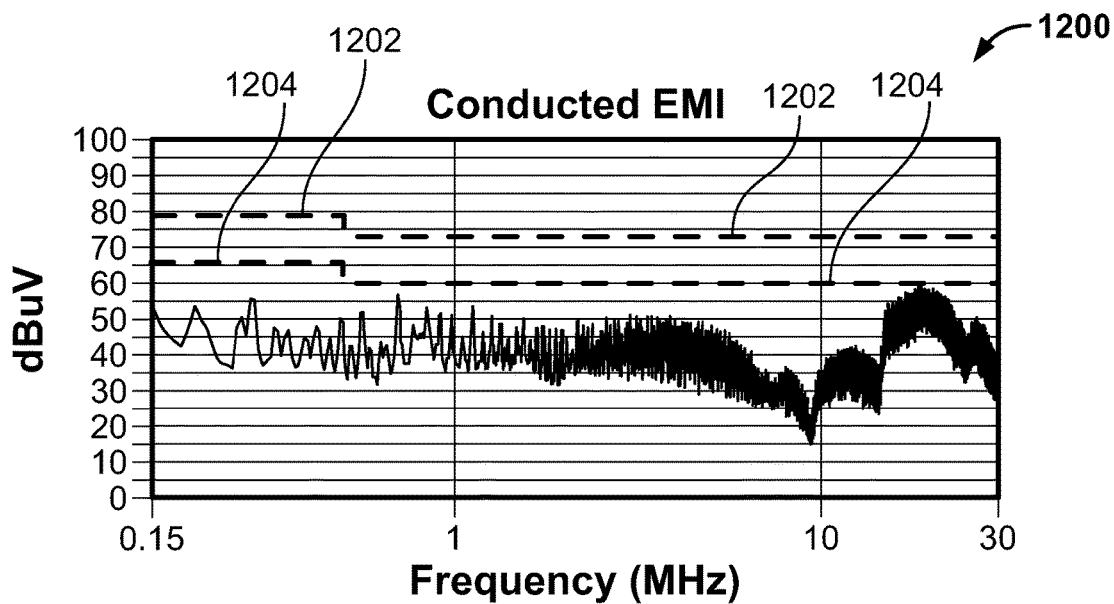
FIG. 12 is a graph of conducted EMI in the power supply of FIGS. 5-7 with its multilayer board having outer conductive ground layers.
Figure 13:
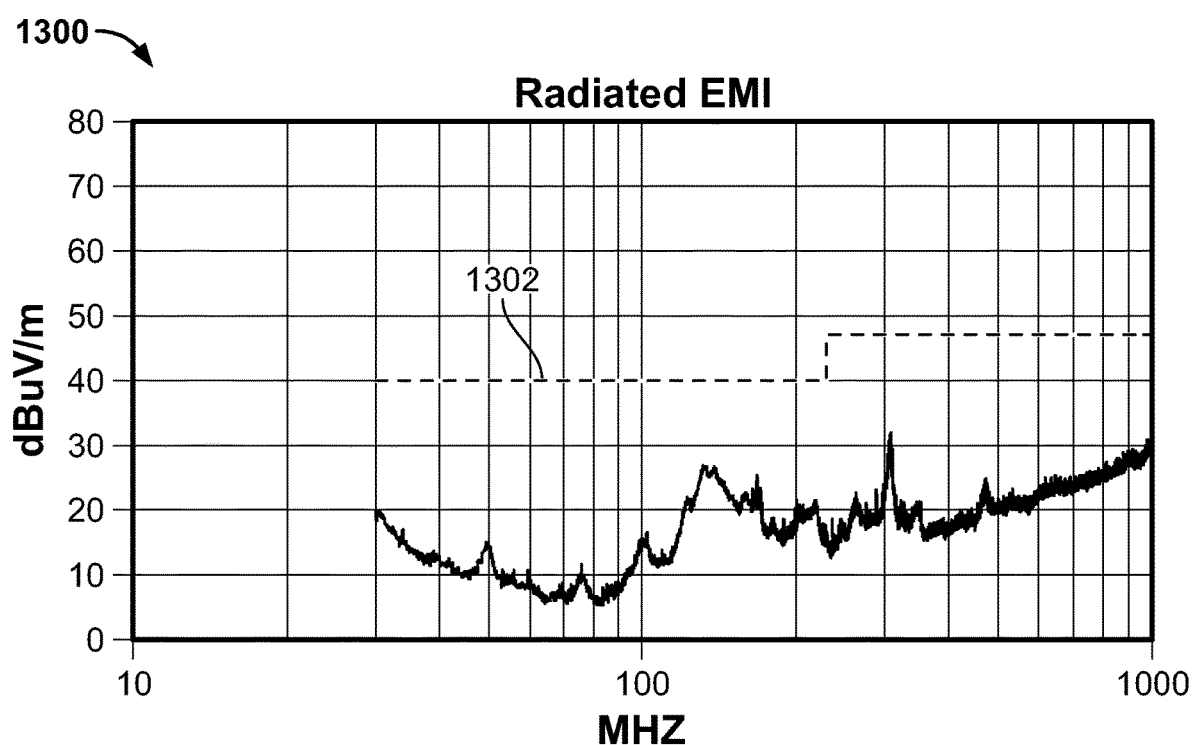
FIG. 13 is a graph of radiated EMI in the power supply of FIGS. 5-7 with its multilayer board having outer conductive ground layers.

FIG. 12 illustrates a graph 1200 of conducted EMI (dBpV) in the power supply 500 of FIGS. 5-7, and FIG. 13 illustrates a graph 1300 of the radiated EMI (dBpV/m) in the power supply 500. As shown, the conducted and radiated EMI in the power supply 500 are reduced compared to the conducted and radiated EMI in the power supply explained above with reference to FIGS. 10 and 11. Additionally, and as shown in FIGS. 12 and 13, the conducted EMI in the power supply 500 remains below Class A international limits (represented by lines 1202, 1204 in the graph 1200), and the radiated EMI in the power supply 500 remains below Class A international limits (represented by lines 1302 in the graph 1300).

The conductive layers and/or conductive material disclosed herein may include any suitable electrically conductive material. For example, the conductive layers and/or conductive material may include electrically conductive metallic materials (e.g., copper, aluminum, gold, silver, etc. and alloys thereof), etc. The dielectric medium disclosed herein may include any suitable electrical insulator material such as porcelain, glass, epoxy, plastic, etc. and/or a combination thereof.

Although the multilayer boards disclosed herein are described and/or shown to include a specific number of conductive layers (e.g., outer conductive layers, inner conductive layers, etc.), it should be apparent to those skilled in the art that more or less conductive layers may be employed without departing from the scope of the disclosure.

The multilayer boards may be used in various different power supplies including, for example, AC/DC power supplies, DC/DC power supplies, etc. For example, any one of the multilayer boards may be employed in a 3 kW AC/DC power supply for providing power (e.g., 12V/246 A) to one or more electronic devices. The power supplies may include, for example, one or more power converters having any suitable topology.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A power supply comprising:
a main circuit board including an AC power input connector having a neutral power connection and a line power connection; and
a multilayer power transmission board for transmitting AC power from one area of the main circuit board to another area of the main circuit board, the multilayer board including at least two conductive neutral layers electrically coupled to the neutral power connection of the AC power input connector, at least two conductive line layers electrically coupled to the line power connection of the AC power input connector, and a dielectric medium positioned between each of the conductive neutral layers and the conductive line layers, the conductive neutral layers and the conductive line layers positioned in an alternating configuration, and one or more X-capacitances formed between at least one of the conductive neutral layers and at least one of the conductive line layers to suppress noise in the power supply when AC power is transmitted from said one area of the main circuit board to said other area of the main circuit board.

2. The power supply of claim 1 wherein the multilayer power transmission board extends in a plane perpendicular to the main circuit board.

3. The power supply of claim 1 wherein the main circuit board includes a filter electrically coupled between the AC power input connector and the power transmission multilayer board.

4. The power supply of claim 1 wherein the main circuit board includes a power output connector adjacent the AC power input connector.

5. The power supply of claim 4 wherein the power output connector includes a DC power output connector.

6. The power supply of claim 1 wherein the at least two conductive neutral layers and the at least two conductive line layers are inner conductive layers, and wherein the multilayer power transmission board includes one or more outer conductive layers substantially surrounding the inner conductive layers.

7. The power supply of claim 6 wherein the one or more outer conductive layers are grounded.

8. The power supply of claim 1 wherein the main circuit board includes a first side and a second side opposing the first side, and wherein said one area of the main circuit board is adjacent to the first side of the main circuit board and said other area of the main circuit board is adjacent to the second side of the main circuit board.

9. The power supply of claim 1 wherein one of the conductive neutral layers is positioned between two of the conductive line layers or wherein one of the conductive line layers is positioned between two of the conductive neutral layers.

10. A power supply comprising:
a main circuit board including a power input connector having a first power connection for providing a first power signal and a second power connection different than the first power connection for providing a second power signal different than the first power signal; and
a multilayer power transmission board for transmitting power from one area of the main circuit board to another area of the main circuit board, the multilayer board including a first conductive layer electrically coupled to the first power connection of the power input connector for receiving the first power signal, a second conductive layer electrically coupled to the second power connection of the power input connector for receiving the second power signal, an inner conductive ground layer separating the first conductive layer and the second conductive layer, outer conductive ground layers electrically coupled to the inner conductive ground layer, a first dielectric medium positioned between one of the outer conductive ground layers and the first conductive layer, a second dielectric medium positioned between the inner conductive ground layer and the first conductive layer, a third dielectric medium positioned between the inner conductive ground layer and the second conductive layer, and a fourth dielectric medium positioned between another one of the outer conductive ground layers and the second conductive layer, wherein the first conductive layer is the only conductive layer positioned between said one of the outer conductive ground layers and the inner conductive ground layer so that the first conductive layer is individually shielded, and wherein the second conductive layer is the only conductive layer positioned between said other one of the outer conductive ground layers and the inner conductive ground layer so that the second conductive layer is individually shielded.

11. The power supply of claim 10 wherein the multilayer power transmission board extends in a plane perpendicular to the main circuit board.

12. The power supply of claim 11 wherein the main circuit board includes a filter electrically coupled between the power input connector and the multilayer power transmission board.

13. The power supply of claim 10 wherein the first conductive layer and the second conductive layer are inner conductive layers, and wherein the outer conductive ground layers substantially surround the inner conductive layers.

14. The power supply of claim 10 wherein the main circuit board includes a first side and a second side opposing the first side, and wherein said one area of the main circuit board is adjacent to the first side of the main circuit board and said other area of the main circuit board is adjacent to the second side of the main circuit board.

15. The power supply of claim 10 wherein the first power connection is an AC neutral power connection or an AC line power connection, and the second power connection is the other one of the AC neutral power connection or the AC line power connection.

16. The power supply of claim 10 wherein the first power connection is a DC positive power connection or a DC reference power connection, and the second power connection is the other one of the DC positive power connection or the DC reference power connection.

* * * * *